(12) United States Patent
Kim et al.

(10) Patent No.: US 10,672,727 B2
(45) Date of Patent: Jun. 2, 2020

(54) SEMICONDUCTOR PACKAGE PROVIDING PROTECTION FROM ELECTRICAL NOISE

(71) Applicant: SAMSUNG ELECTRONICS CO., LTD., Suwon-si (KR)

(72) Inventors: Hyung Joon Kim, Suwon-si (KR); Jung Ho Shim, Suwon-si (KR); Jun Young Won, Suwon-si (KR); Han Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/108,202

(22) Filed: Aug. 22, 2018

(65) Prior Publication Data

US 2019/0206813 A1 Jul. 4, 2019

(30) Foreign Application Priority Data

Jan. 2, 2018 (KR) ........................ 10-2018-0000413

(51) Int. Cl.
*H01L 23/64* (2006.01)
*H01L 23/552* (2006.01)
(Continued)

(52) U.S. Cl.
CPC ............ *H01L 23/642* (2013.01); *H01L 23/12* (2013.01); *H01L 23/3192* (2013.01);
(Continued)

(58) Field of Classification Search
CPC combination set(s) only.
See application file for complete search history.

(56) References Cited

U.S. PATENT DOCUMENTS

2012/0182066 A1 7/2012 Merkle et al.
2014/0124906 A1 5/2014 Park et al.
(Continued)

FOREIGN PATENT DOCUMENTS

JP H07-321497 A 12/1995
JP 2012-151477 A 8/2012
(Continued)

OTHER PUBLICATIONS

Office Action and Search Report issued in corresponding Taiwanese Application No. 107128420, dated Apr. 15, 2019.
(Continued)

*Primary Examiner* — Nduka E Ojeh
(74) *Attorney, Agent, or Firm* — Sughrue Mion, PLLC

(57) ABSTRACT

A semiconductor package includes a support member having first and second surfaces opposing each other, having first and second through-holes, spaced apart from each other, and having a wiring structure that connects the first and second surfaces to each other; a connection member disposed on the second surface of the support member and having redistribution layers connected to the wiring structure; a semiconductor chip disposed in the first through-hole and having connection pads connected to the redistribution layers; a second passive component disposed in the second through-hole and connected to the redistribution layers; a first encapsulant disposed on the first surface of the support member and encapsulating the first passive component; and a second encapsulant encapsulating the support member, the first encapsulant, and the semiconductor chip.

13 Claims, 12 Drawing Sheets

(51) Int. Cl.
*H01L 23/12* (2006.01)
*H01L 23/31* (2006.01)
*H01L 23/36* (2006.01)
*H01L 23/498* (2006.01)
*H01L 23/538* (2006.01)

(52) U.S. Cl.
CPC ........ *H01L 23/36* (2013.01); *H01L 23/49822* (2013.01); *H01L 23/5389* (2013.01); *H01L 23/552* (2013.01); *H01L 23/645* (2013.01); *H01L 23/49816* (2013.01)

(56) References Cited

U.S. PATENT DOCUMENTS

| | | | | |
|---|---|---|---|---|
| 2015/0366063 | A1* | 12/2015 | Takagi | H05K 3/284 361/743 |
| 2016/0043047 | A1 | 2/2016 | Shim et al. | |
| 2016/0190108 | A1* | 6/2016 | Lee | H01L 23/3128 257/692 |
| 2016/0336249 | A1* | 11/2016 | Kang | H01L 23/3128 |
| 2016/0338202 | A1* | 11/2016 | Park | H01L 23/5389 |
| 2016/0351608 | A1 | 12/2016 | Huang et al. | |
| 2017/0162527 | A1 | 6/2017 | Kim et al. | |
| 2017/0287825 | A1 | 10/2017 | Lee et al. | |
| 2017/0287853 | A1 | 10/2017 | Kim et al. | |
| 2018/0366426 | A1 | 12/2018 | Lee et al. | |

FOREIGN PATENT DOCUMENTS

| | | |
|---|---|---|
| KR | 10-2014-0057982 A | 5/2014 |
| KR | 10-2016-0132749 A | 11/2016 |
| KR | 10-2017-0112343 A | 10/2017 |
| KR | 10-2017-0112363 A | 10/2017 |
| TW | 201618196 A | 5/2016 |
| TW | 201635480 A | 10/2016 |
| TW | 201642450 A | 12/2016 |
| TW | 201721776 A | 6/2017 |
| TW | 201735295 A | 10/2017 |

OTHER PUBLICATIONS

Communication dated Apr. 30, 2019, issued by the Korean Intellectual Property Office in counterpart Korean Patent Application No. 10-2018-0000413.

* cited by examiner

SEMICONDUCTOR PACKAGE PROVIDING PROTECTION FROM ELECTRICAL NOISE

CROSS-REFERENCE TO RELATED APPLICATION(S)

This application claims benefit of priority to Korean Patent Application No. 10-2018-0000413 filed on Jan. 2, 2018 in the Korean Intellectual Property Office, the disclosure of which is incorporated herein by reference in its entirety.

TECHNICAL FIELD

The present disclosure relates to a semiconductor package in which at least one semiconductor chip and a plurality of passive components are mounted.

BACKGROUND

In accordance with an increase in a size of displays for mobile apparatuses, the necessity to increase capacity of batteries has increased. In accordance with the increase in the capacity of the batteries, an area occupied by the battery in the mobile apparatus has increased, and it has been thus required to reduce a size of a printed circuit board (PCB). Therefore, an area in which components are mounted has reduced, such that an interest in modularization has continuously increased.

Meanwhile, an example of the related art of mounting a plurality of components may include chip on board (COB) technology. A COB manner is a manner of mounting individual passive elements and a semiconductor package on a printed circuit board using surface mounting technology (SMT). However, in such a manner, a wide mounted area is required in order to maintain a minimum interval between components, electromagnetic interference (EMI) between the components is large, and in particular, a distance between the semiconductor chip and the passive components is great, such that electric noise is increased.

SUMMARY

An aspect of the present disclosure may provide a semiconductor package capable of solving electrical noise while significantly reducing spatial consumption in modularizing a semiconductor chip and a plurality of passive components.

According to an aspect of the present disclosure, a semiconductor package may include a support member having first and second surfaces opposing each other, having first and second through-holes, spaced apart from each other, and having a wiring structure that connects the first and second surfaces to each other; a connection member disposed on the second surface of the support member and having redistribution layers connected to the wiring structure; a semiconductor chip disposed in the first through-hole and having connection pads connected to the redistribution layers; a second passive component disposed in the second through-hole and connected to the redistribution layers; a first encapsulant disposed on the first surface of the support member and encapsulating the first passive component; and a second encapsulant encapsulating the support member, the first encapsulant, and the semiconductor chip.

According to another aspect of the present disclosure, a semiconductor package may include a support member having first and second surfaces opposing each other, having at least one through-hole, and having a wiring structure that connects the first and second surfaces to each other; a first passive component disposed on the first surface of the support member and connected to the wiring structure; a connection member disposed on the second surface of the support member and having redistribution layers connected to the wiring structure; a semiconductor chip disposed in the at least one through-hole and having connection pads connected to the redistribution layers; a second passive component disposed in the at least one through-hole and connected to the redistribution layers; and an encapsulant encapsulating the first passive component disposed on the first surface of the support member, and the semiconductor chip and the second passive component.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
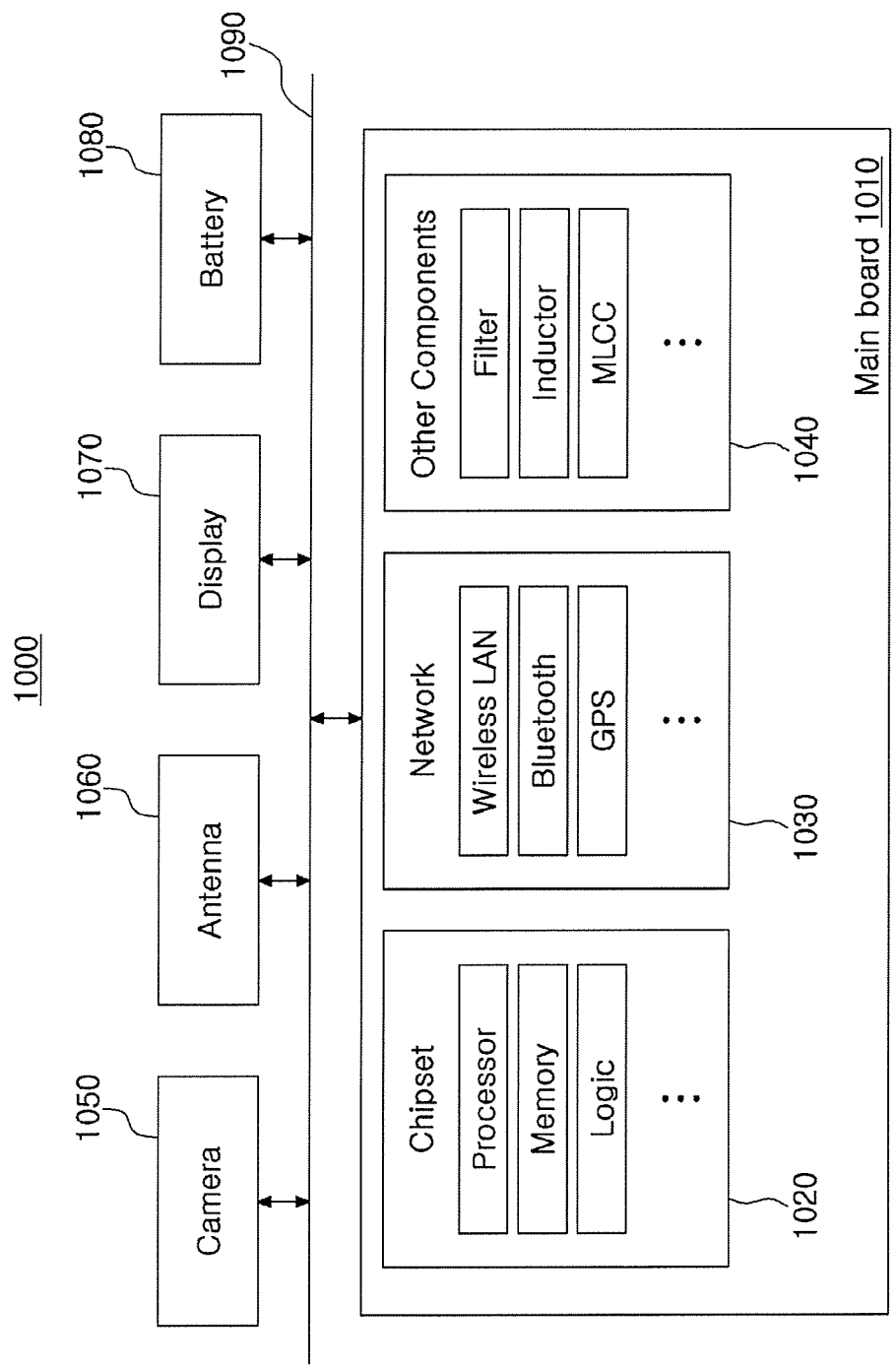
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
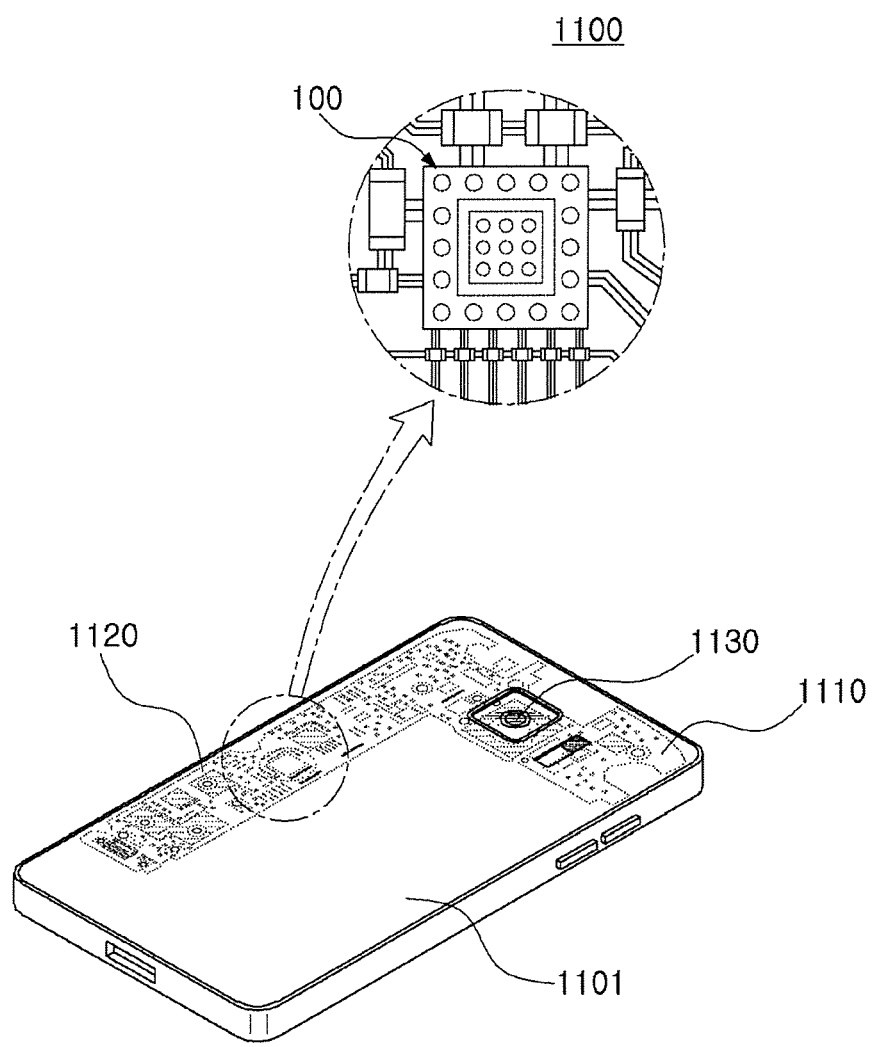
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mother board 1110 may be accommodated in a body 1101 of a smartphone 1100, and various components 1120 may be physically or electrically connected to the mother board 1110. In addition, other components that may or may not be physically or electrically connected to the main board 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
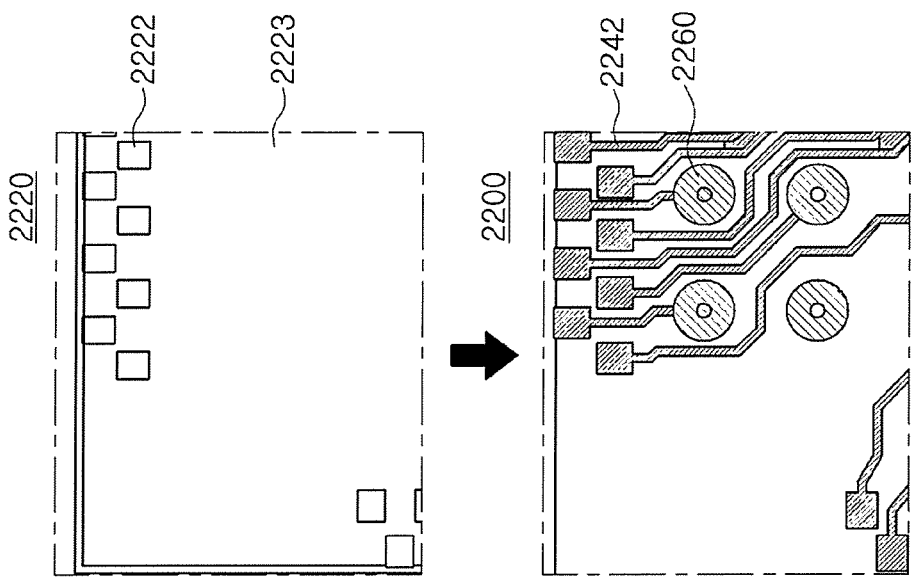
FIGS. 3A and 3B are schematic cross-sectional views illustrating states of a fan-in semiconductor package before and after being packaged.
Figure 3A:
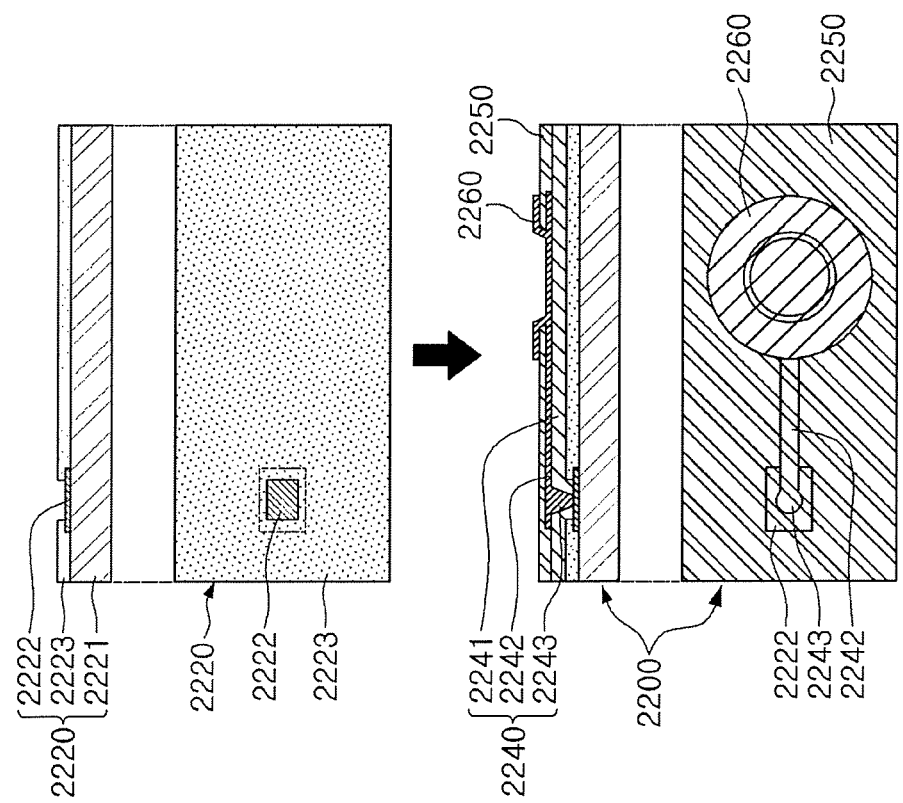
Figure 4:
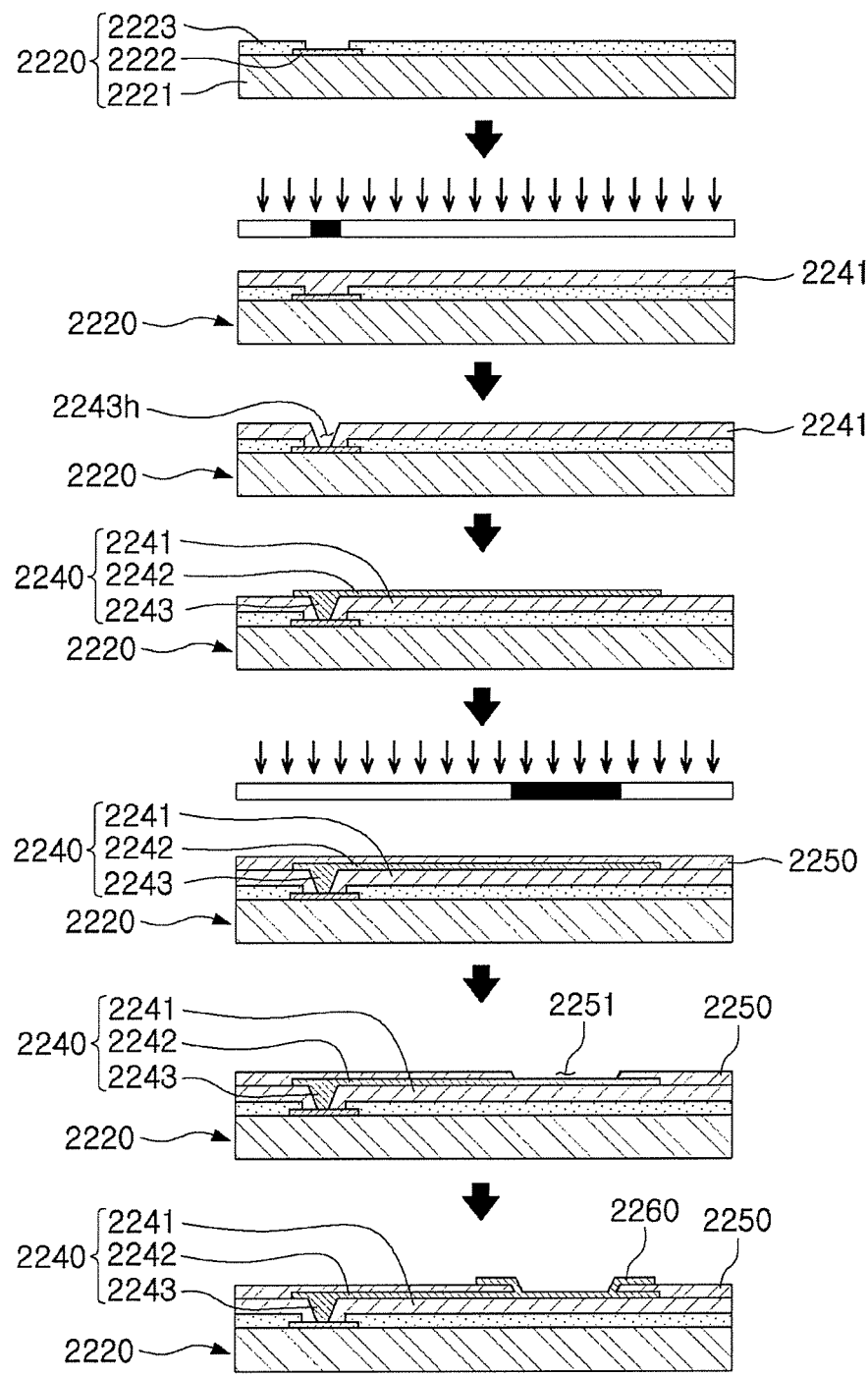
FIG. 4 is a schematic cross-sectional view illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a small size. In addition, due to the disadvantage described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
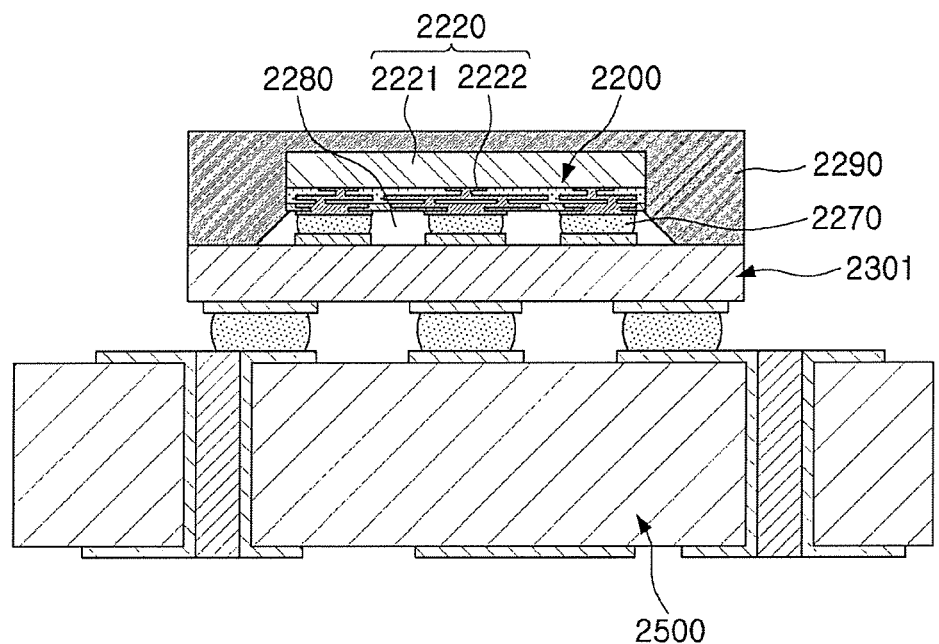
FIG. 5 is a schematic cross-sectional view illustrating a case in which a fan-in semiconductor package is mounted on an interposer substrate and is finally mounted on a main board of an electronic device.
Figure 6:
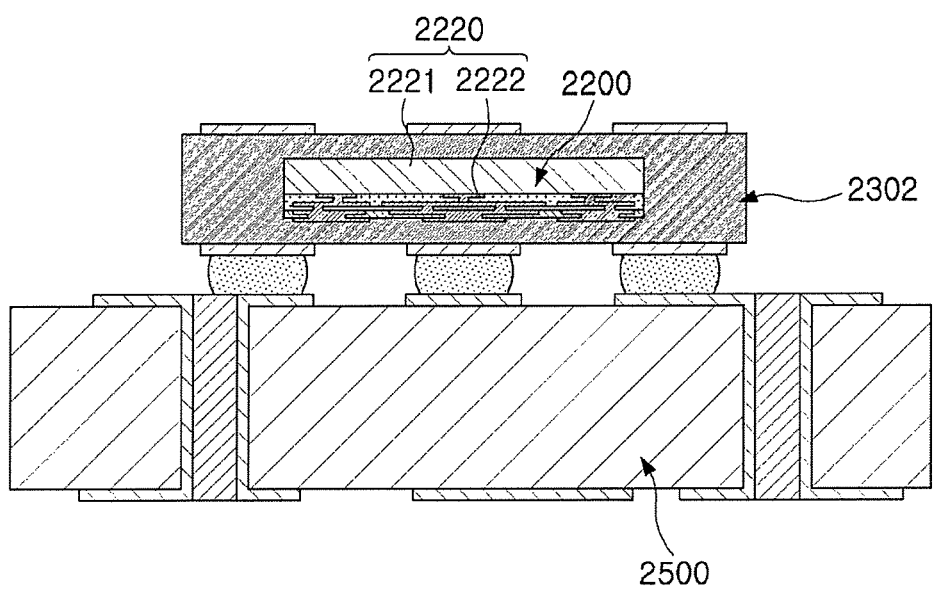
FIG. 6 is a schematic cross-sectional view illustrating a case in which a fan-in semiconductor package is embedded in an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device, and FIG. 6 is a schematic cross-sectional view illustrating a case in which a fan-in semiconductor package is embedded in an interposer substrate and is finally mounted on a main board of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. In this case, low melting point metal or alloy balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
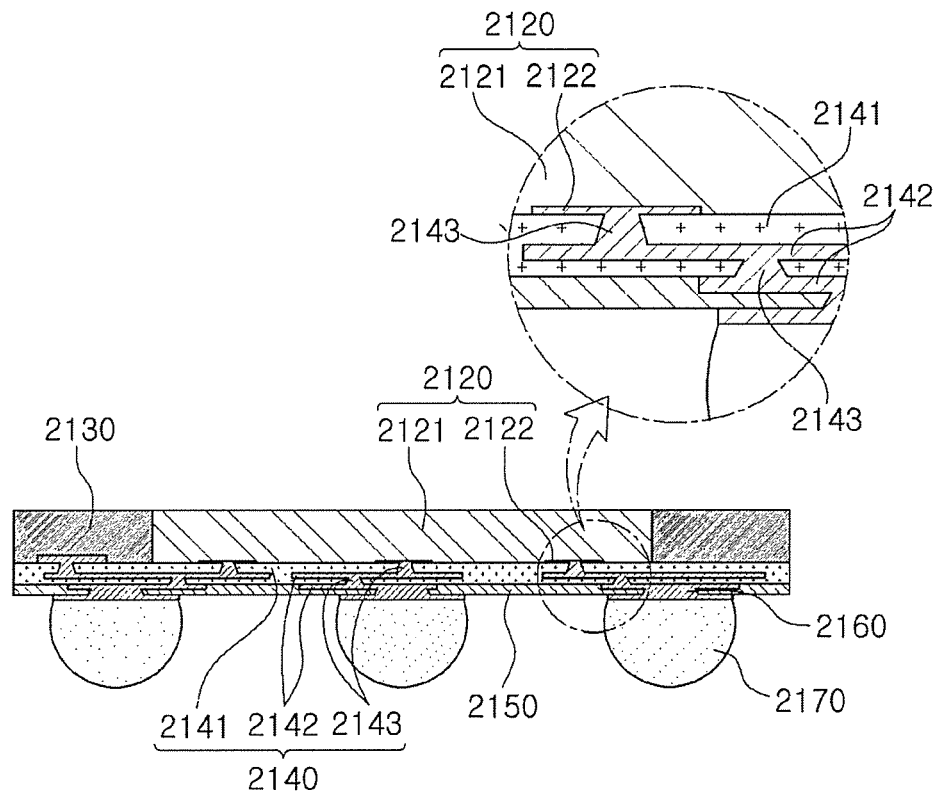
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2202 may be further formed on the connection member 2140, and an underbump metal layer 2160 may be further formed in openings of the passivation layer 2202. Low melting point metal or alloy balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2241, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that becomes small as they become close to the semiconductor chip (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
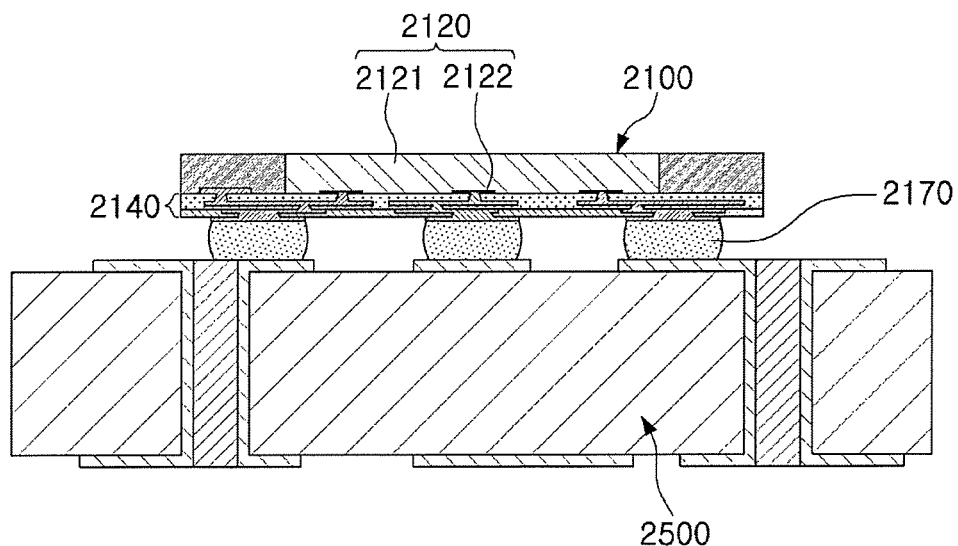
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through low melting point metal or alloy balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, various exemplary embodiments of the present disclosure will be described in detail with reference to the accompanying drawings.

Figure 9:
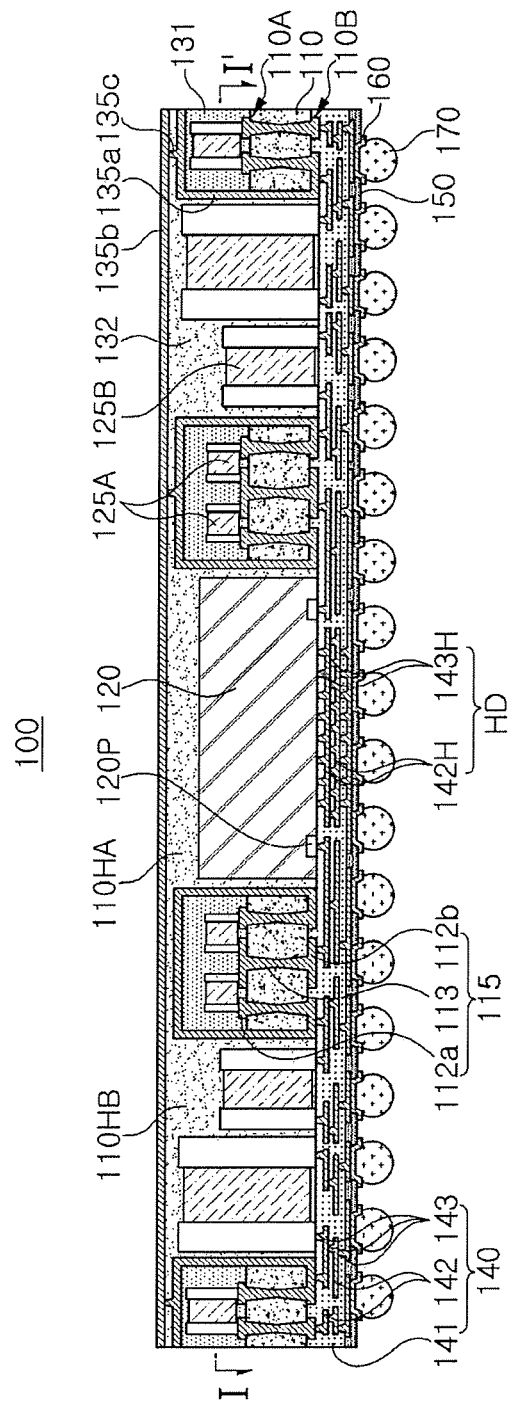
FIG. 9 is a schematic cross-sectional view illustrating a semiconductor package according to an exemplary embodiment in the present disclosure.
Figure 10:
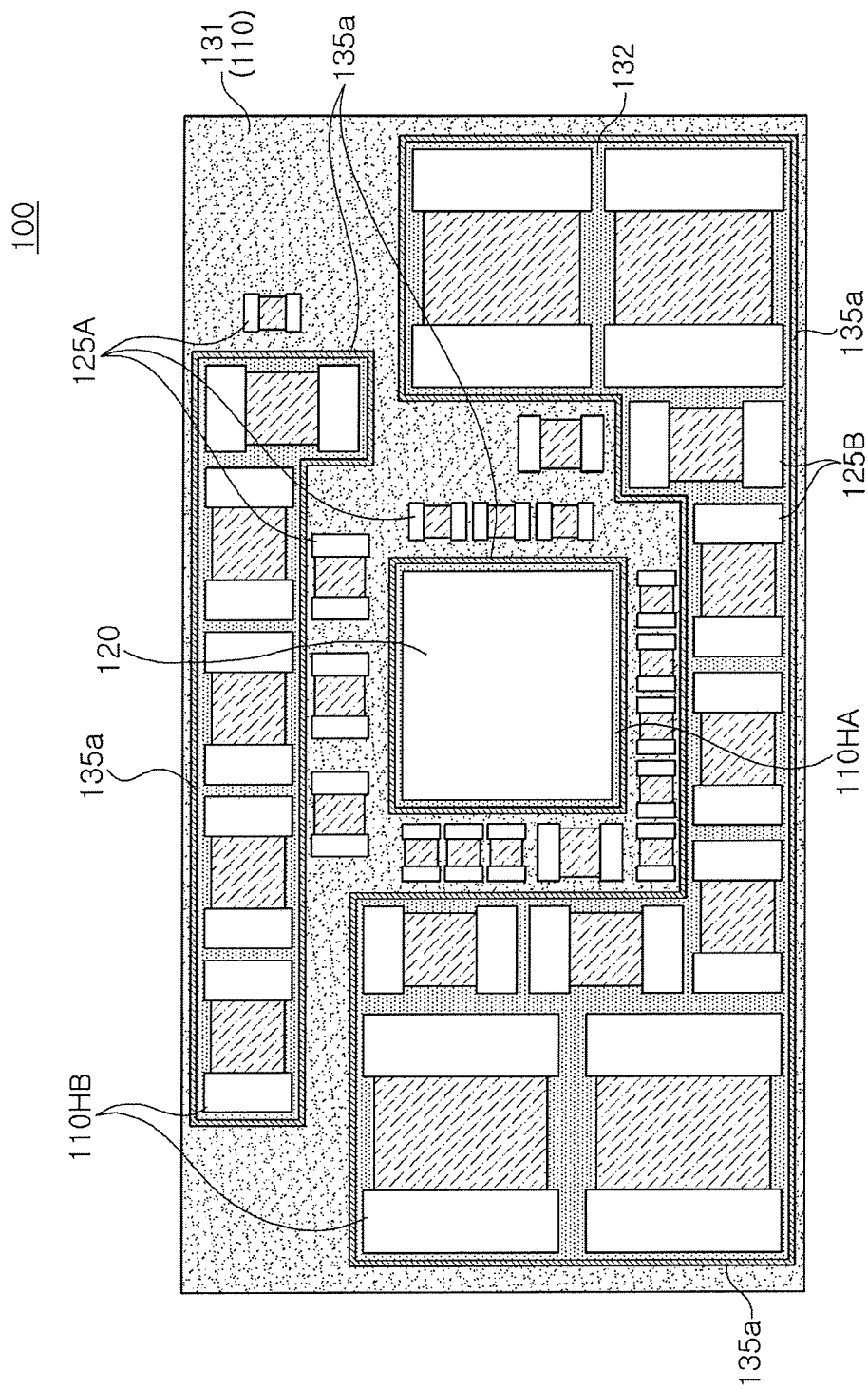
FIG. 10 is a plan view taken along line I-I' of the semiconductor package of FIG. 9.

FIG. 9 is a schematic cross-sectional view illustrating a semiconductor package according to an exemplary embodiment in the present disclosure and FIG. 10 is a plan view taken along line I-I' of the semiconductor package of FIG. 9.

Referring to FIGS. 9 and 10, a semiconductor package 100 according to the present exemplary embodiment may include a support member 110 having a first surface 110A and 110B opposing each other and having a first through-hole 110HA and a second through-hole 110HB, spaced apart from each other, a first passive component 125A disposed on the first surface 110A of the support member 110, a connection member 140 disposed on the second surface 110B of the support member 110 and having redistribution layers 142 and 143, a semiconductor chip 120 disposed in the first through-hole 110HA and having connection pads 120P connected to the redistribution layers 142 and 143, and a second passive component 125B disposed in the second through-hole 110HB and connected to the redistribution layers 142 and 143.

According to the present exemplary embodiment, an upper surface (i.e., a first surface) of the support member 110 as well as an upper surface of the connection member 140 may be utilized as an additional mounting space for a passive component (a first passive component 125A).

Specifically, the passive component 125B may be mounted on the upper surface of the connection member 140 within the second through-hole 110HB while the first passive component 125A may be disposed on the first surface 110A of the support member 110. A plurality of second through-holes 110HB (e.g., two through-holes) in which the second passive component 125B is mounted may be provided and the plurality of second through-holes 110HB may be disposed to surround the first through-hole 110HA. Meanwhile, the plurality of second through-holes 110HB may have different positions, sizes, shapes, or the like to significantly increase space density.

The first and second passive components 125A and 125B may have different sizes (e.g., heights, areas, volumes, or the like). As illustrated in FIGS. 9 and 10, the first passive component 125A may have a size greater than that of the second passive component 125B. The first passive component 125A may be disposed on a first surface 110A of the support member 110 in a relatively narrow space. At least one of the first and second passive components 125A and 125B may include a plurality of passive components having different sizes.

The encapsulant employed in the present exemplary embodiment may include a first encapsulant 131 encapsulating the first passive component 125A and a second encapsulant 132 encapsulating the semiconductor chip 120 and the second passive component 125B. The first encapsulant 131 may be disposed on the first surface 110A of the support member 110.

Here, the second encapsulant 132 may be provided as a portion of a supporter which is substantially coupled to the support member 110. Specifically, in the semiconductor package 100, a thickness of the support member 110 may be determined by depths of the through-holes 110HA and 110HB in consideration of the mounted components such as the semiconductor chip 120 and the like, and the thickness of the support member 110 employed in the present exemplary embodiment may be designed to be smaller than an actually desired thickness in consideration of (i.e., by summing) a thickness of the second encapsulant 132.

For example, as illustrated in FIG. 9, a mounted height of the semiconductor chip 120 disposed in the first through-hole 110HA may be greater than the thickness of the support member 110. A height (e.g., a summation of the thickness of the support member 110 and the thickness of the first encapsulant 131 disposed on the support member 110) of the upper surface of the first encapsulant 131 may be higher than the mounted height of the semiconductor chip 120.

A side surface of the first encapsulant 131 may have a coplanar surface which is substantially flat with a side wall of the support member 110. Such a flat coplanar surface may be understood as a result obtained by forming the first and second through-holes 110HA and 110HB after mounting the first passive component 125A and applying the first encapsulant 131 (see FIGS. 11C and 11D).

The second encapsulant 132 may be provided for the entire package structure. For example, as illustrated in FIG.

9 (also see FIG. 12B), the second encapsulant 132 may be formed to encapsulate the support member 110 on which the first encapsulant 131 is formed, and the semiconductor chip 120 and the second passive component 125B which are mounted in the first and second through-holes 110HA and 110HB, respectively.

As illustrated in FIG. 9, a first shielding layer 135a may be disposed on side surfaces of the support member 110 and the first encapsulant 131, and the upper surface of the first encapsulant 131. The first shielding layer 135a may perform a shielding function related to the first passive component 125A disposed on the support member 110 as well as a function of shielding electromagnetic interference between the semiconductor chip 120 and the second passive component 125B which are disposed in the different through-holes 110HA and 110HB.

The semiconductor package 100 according to the present exemplary embodiment may be disposed on the second encapsulant 132 and may further include a second shielding layer 135b connected to the first shielding layer 135a. The second shielding layer 135b may be provided as a single shielding structure connected to the first shielding layer 135a by a conductive via 135c formed in the second encapsulant 132.

As described above, a size of a module may be reduced by utilizing the first surface 110A of the support member 110 as the mounted area, and noise on electromagnetic interference (EMI) between the components may be reduced by reducing an interval between the components. EMI shielding performance may be improved by introducing an additional shielding structure. According to the structure described above, since an area occupied by a battery increases as capacity of the battery is increased, this structure may contribute greatly to miniaturization of a surface mounting technology (SMT) module such as chip on board (COB).

The support member 110 employed in the present exemplary embodiment may have a wiring structure 115 that connects the first and second surfaces 110A and 110B to each other.

On the second surface 110B of the support member 110, the wiring structure 115 may be connected to the redistribution layer 135 of the connection member 140. The semiconductor chip 120 mounted in the first through-hole 110HA may include connection pads 120P and the connection pads 120P may be connected to the redistribution layers 142 and 143 of the connection member 140.

The second passive component 125B disposed in the second through-hole 110HB may be connected to the redistribution layers 142 and 143 of the connection member 140. The first passive component 125A may be disposed on the first surface 110A of the support member 110 and connected to the wiring structure 115, and may also be connected to the redistribution layers 142 and 143 of the connection member 140 through the wiring structure 115 in a way similar to the second passive component 125B.

A passivation layer 150 may be disposed on a lower surface of the connection member 140, and an underbump metal layer 160 electrically connected to the redistribution layer 142 may be disposed in openings of the passivation layer 150. Electrical connection structures 170 may be electrically connected to the redistribution layer 142 through the underbump metal layer 160.

The respective components included in the semiconductor package 100 according to the present exemplary embodiment will hereinafter be described in more detail.

The support member 110 may improve rigidity of the semiconductor package 100 depending on certain materials, and serve to secure uniformity of a thickness of an encapsulant 130. The semiconductor chip 120 and the second passive component 125B may be disposed in the first and second through-holes 110HA and 110HB of the support member 110, respectively. The semiconductor chip 120 and the second passive component 125B may be disposed to be spaced apart from wall surfaces of the first and second through-holes 110HA and 110HB by a predetermined distance.

The support member 110 may include an insulating structure, and the insulating structure is not particularly limited, but a thermosetting resin such as an epoxy resin, a thermoplastic resin such as polyimide, a resin in which the thermosetting resin or the thermoplastic resin is impregnated together with inorganic filler in a core material such as a glass fiber (a glass cloth or a glass fabric), for example, prepreg, Ajinomoto Build-up Film (ABF), FR-4, Bismaleimide Triazine (BT), or the like may be used. Alternatively, photo imagable dielectric (PID) may also be used as the insulating structure.

The first shielding layer 135a may be disposed to surround the second passive component 125B disposed in the second through-hole 110HB (see FIG. 10) while surrounding the first passive component 125A in the first encapsulant 131 (see FIG. 9). The first shielding layer 135a may be connected to a ground GND pattern. For example, the first shielding layer 135a may be connected to the ground pattern among the redistribution layers 142 and 143 of the connection member 140. Together with other shielding layer elements 135b and 135c, a material of the first shielding layers 135a may be a conductive material such as copper (Cu), aluminum (Al), silver (Ag), tin (Sn), gold (Au), nickel (Ni), titanium (Ti), or alloys thereof, and the first shielding layer 135a may be formed by a plating process.

The wiring structure 115 of the support member 110 may include first and second wiring patterns 112a and 112b and a via 113. An insulating layer configuring the support member 110 may be configured in multiple layers and the wiring structure 115 may also have a multilayer pattern. The wiring structure of the support member 110 may have a thickness greater than that of the redistribution layers 142 and 143 of the connection member 140. The support member 110 in which the wiring structure 115 is implemented may be utilized as a package for package-on-package (PoP).

The semiconductor chip 120 may be an integrated circuit (IC) provided in an amount of several hundreds to several millions of elements or more integrated in a single chip. In this case, the integrated circuit may be, for example, a power management IC (PMIC), but is not limited thereto. Meanwhile, the semiconductor chip 120 may be an integrated circuit in a bare state in which a separate bump or redistribution layer is not formed. The integrated circuit may be formed on the basis of an active wafer. In this case, a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer (not illustrated) exposing the connection pads 120P may be formed on the body, and may be an oxide film, a nitride film, or the like, or a double layer of an oxide layer and a nitride layer. An insulating layer (not illustrated), and the like, may be further disposed in other required positions.

The first and second passive components 125A and 125B may be multilayer ceramic capacitors (MLCCs), low inductance chip capacitors (LICCs), inductors, beads, or various other kinds of filters, or the like, respectively. The first and second passive components 125A and 125B may have different thicknesses and may have thicknesses different from that of the semiconductor chip 120. In the semiconductor package 100 according to the present exemplary embodiment, the first and second passive components 125A and 125 may be divided and arranged in the first and second through-holes 110HA and 110HB so that a thickness deviation between the passive components 125A and 125B and the semiconductor chip 120 is significantly reduced.

The first and second encapsulant 131,132 may include an insulating material. The first encapsulant 131 may be formed of the same resin as the second encapsulant 132. The insulating material may be a material including an inorganic filler and an insulating resin, for example, a thermosetting resin such as an epoxy resin, a thermoplastic resin such as a polyimide resin, a resin having a reinforcing material such as an inorganic filler included in the thermosetting resin and the thermoplastic resin, such as Ajinomoto Build up Film (ABF), FR-4, Bismaleimide Triazine (BT), or the like. In addition, the known molding material such as an epoxy molding compound (EMC), or the like, may be used, and a photo imagable encapsulant (PIE) may be used, if necessary. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material.

The connection pads 120P of the semiconductor chip 120 may be extended and redistributed using the connection member 140. In addition, the connection member 140 may electrically connect the semiconductor chip 120 and the first and second passive components 125A and 125B to each other. Several tens to several hundreds of connection pads 120P of the semiconductor chip 120 having various functions may be redistributed by the connection member 140, and may be physically or electrically externally connected through the electrical connection structures 170 depending on the functions. The connection member 140 may include insulating layers 141, wiring patterns 142 disposed on the insulating layers 141, and vias 143 penetrating through the insulating layers 141 and connecting the wiring patterns 142 to each other. The connection member 140 may be formed of a single layer, and may also be formed of layers of which the number is greater than that illustrated in the drawings. A material of each of the insulating layers 141 may be an insulating material. In this case, a photosensitive insulating material such as a PID resin may also be used as the insulating material other than the insulating materials as described above. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 and 143 may serve to substantially redistribute the connection pads 120P. The redistribution layers 142 and 143 may include, for example, a conductive material such as copper (Cu), aluminum (Al), silver (Ag), tin (Sn), gold (Au), nickel (Ni), titanium (Ti), or alloys thereof. The redistribution layer 142,143 may perform various functions depending on designs of a corresponding layer. For example, the redistribution layers 142 and 143 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like.

The connection member 140 may include a heat dissipation structure HD disposed on an active surface of the semiconductor chip 120. The heat dissipation structure HD may include a pattern 142H and a via 143H which are formed together with the redistribution layers, and may be a form of stack via as in the present exemplary embodiment, but is not limited thereto. The heat dissipation structure HD may be connected to the main board through the electrical connection structures 170 to effectively dissipate heat generated from the semiconductor chip 120.

The passivation layer 150 may protect the connection member 140 from external physical or chemical damage. The passivation layer 150 may have openings exposing at least portions of the redistribution layer 142 and 143 of the connection member 140. The number of openings formed in the passivation layer 150 may be several tens to several thousands. The passivation layer 150 may include an insulating resin and an inorganic filler, but may not include a glass fiber. For example, the passivation layer 150 may be formed of ABF, but is not limited thereto.

The underbump metal layer 160 may improve connection reliability of the electronic connection structures 170, resulting in improvement of board level reliability of the semiconductor package 100. The underbump metal layer 160 may be connected to the redistribution layers 142 and 143 of the connection member 140 exposed through the openings of the passivation layer 150. The underbump metal layer 160 may be formed in the openings of the passivation layer 150 by the known metallization method using the known conductive material such as a metal, but is not limited thereto.

The electrical connection structures 170 may be additionally configured to physically or electrically connect the semiconductor package 100 to the outside. For example, the semiconductor package 100 may be mounted on the main board of the electronic device through the electrical connection structures 170. Each of the electrical connection structures 170 may be formed of a conductive material such as a low melting point metal or alloy, or the like. Each of the electrical connection structures 170 may be a land, a ball, a pin, or the like. The electrical connection structures 170 may be formed in multiple layers or a single layer. In a case in which the electrical connection structures 170 are formed in the multiple layers, the electrical connection structures 170 may include a copper pillar and a low melting point metal or alloy, and in a case in which the electrical connection structures 170 are formed in the single layer, the electrical connection structures 170 may include a low melting point metal or copper such as Sn—Ag or Sn—Al—Cu, but is not limited thereto. The number, an interval, a disposition form, and the like, of electrical connection structures 170 are not particularly limited. For example, the electrical connection structures 170 may be provided in an amount of several tens to several thousands according to the number of connection pads 120P, or may be provided in an amount of several tens to several thousands or more or several tens to several thousands or less.

At least some of the electrical connection structures 170 may be disposed in a fan-out region. The fan-out region refers to a region except for the region in which the semiconductor chip 120 is disposed. A fan-out package may have excellent reliability as compared to a fan-in package, may implement a plurality of input/output (I/O) terminals, and may facilitate 3D interconnection. In addition, as compared to a ball grid array (BGA) package, a land grid array (LGA) package, or the like, the fan-out package may be manufactured to have a small thickness.

FIGS. 11A through 11E are cross-sectional views for describing main processes of a process of manufacturing a support member employed in the semiconductor package FIG. 9.

Figure 11A:
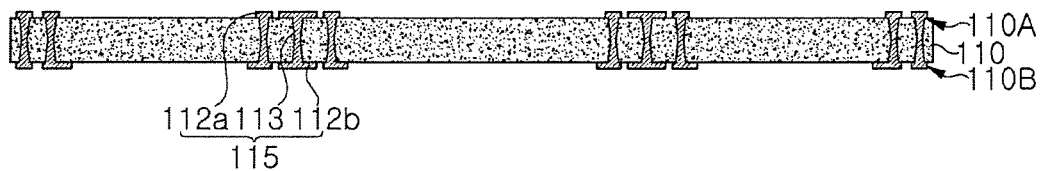
FIGS. 11A through 11E are cross-sectional views for describing main processes of a process of manufacturing a support member employed in the semiconductor package FIG. 9.

Referring to FIG. 11A, the support member 110 having the first and second surfaces 110A and 110B opposing each other may be prepared and the wiring structure 115 connecting the first and second surfaces 110A and 110B to each other may be formed.

The support member 110 may include an insulating structure. For example, the insulating structure may include a thermosetting resin such as an epoxy resin and a thermoplastic resin such as polyimide, and may further include various types of reinforcing materials such as a glass fiber and/or a filler, for example, prepreg, ABF, FR-4, BT, or the like.

The via 113 penetrating through the insulating structure, and the first and second wiring patterns 112a and 112b disposed on the first and second surfaces 110A and 110B of the support member 110 and electrically connected to each other by the via 113 may be formed. The first wiring pattern 112a may provide a region for connection with a connection terminal of the first passive component 125A. The wiring structure 115 may be provided in a multilayer structure of three or more layers, if necessary. The first and second wiring patterns 112a and 112b and the via 113 may be formed of a conductive material such as copper (Cu), aluminum (Al), silver (Ag), tin (Sn), gold (Au), nickel (Ni), titanium (Ti), or alloys thereof, and may be formed by, for example, a plating process.

Figure 11B:
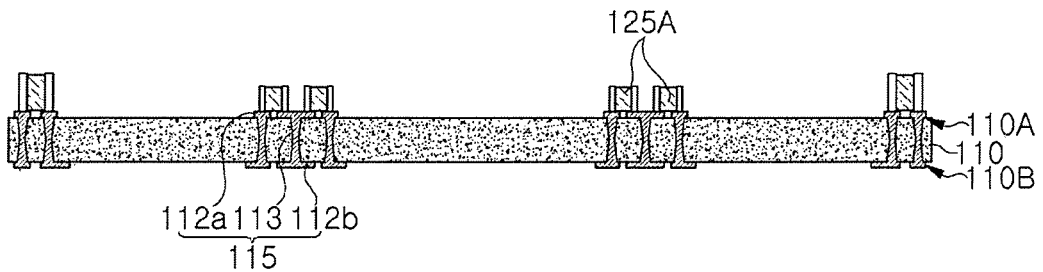

Next, referring to FIG. 11B, the first passive component 125A may be mounted on the first surface 110A of the support member 110.

The first passive component 125A may be a passive component having a relatively small size. That is, the first passive component 125A may be a passive component having a size smaller than that of the second passive component 125B (FIG. 12A) to be mounted in the through-hole structure. For example, the first passive component 125A may be a MLCC, a LICC, an inductor, a bead, various kinds of filters, and the like. A height of the first passive component 125A may determine a depth of the mounting space together with the thickness of the support member 110. The first passive component 125A may be bonded to the first wiring pattern 112a in a surface mounting technology. That is, a connection terminal of the first passive component 125A may be connected to the first wiring pattern 112a by Au or a low melting point alloy.

Figure 11C:
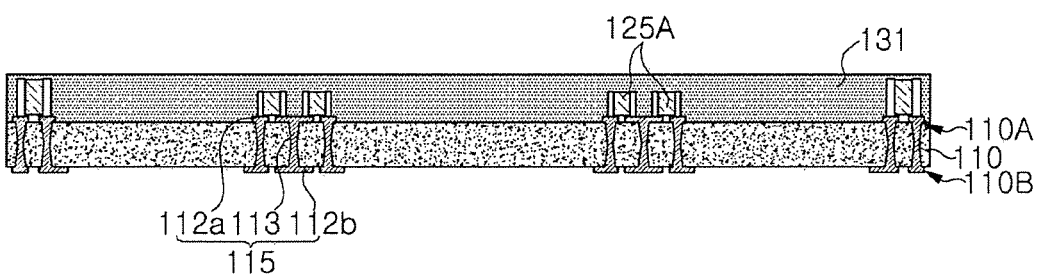

Next, referring to FIG. 11C, the first encapsulant 131 may be applied onto the first surface 110A of the support member 110 so as to cover the first passive component 125A.

The first encapsulant 131 may be formed by the known method and may encapsulate the first passive component 125A disposed on the first surface 110A of the support member 110. For example, the first encapsulant 131 may also be formed by applying a liquid resin or laminating the film and then curing the laminated film. The first passive component 125A may be fixed to the support member 110 through the curing process. For example, a method of laminating ABF may be used. In this case, a method of performing a hot press process of pressing the film for a predetermined time at a high temperature, decompressing the film, and then cooling the film to room temperature, and separating a work tool by cooling the film in a cold press process, or the like, may be used.

As examples of another method of applying the first encapsulant, various processes such as a screen printing method of applying ink with a squeegee, a spray printing method of applying ink in a mist form, and the like, may be used. As the first encapsulant 131, FR-4, BT resin, and the like may be used other than ABF. In addition, the known molding material such as an epoxy molding compound (EMC), or the like, may also be used, and a photo imagable encapsulant (PIE), which is a photosensitive material, may be used in a certain example.

Figure 11D:
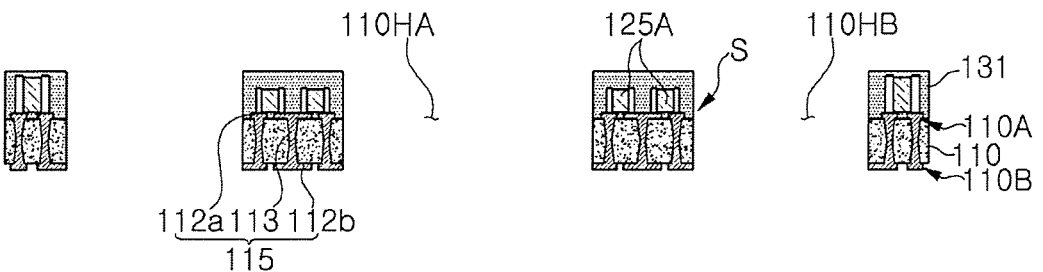

Next, referring to FIG. 11D, the first and second through-holes 110HA and 110HB may be formed in the support member 110.

The first and second through-holes 110HA and 110HB may provide a space in which the second passive component 125B having a thickness greater than those of the semiconductor chip 120 and the first passive component 125A is mounted. The first and second through-holes 110HA and 110HB may be formed using a mechanical drilling and/or laser drilling. However, the first and second through-holes 110HA and 110HB are not limited thereto, and may also be formed by a sand blasting method using particles for polishing, a dry etching method using plasma, or the like. In a case in which the first and second through-holes 110HA and 110HB may be formed using a mechanical drilling and/or a laser drill, resin smear may be removed from surfaces of the first and second through-holes 110HA and 110HB by performing a desmear process using a permanganate method or the like.

Figure 11E:
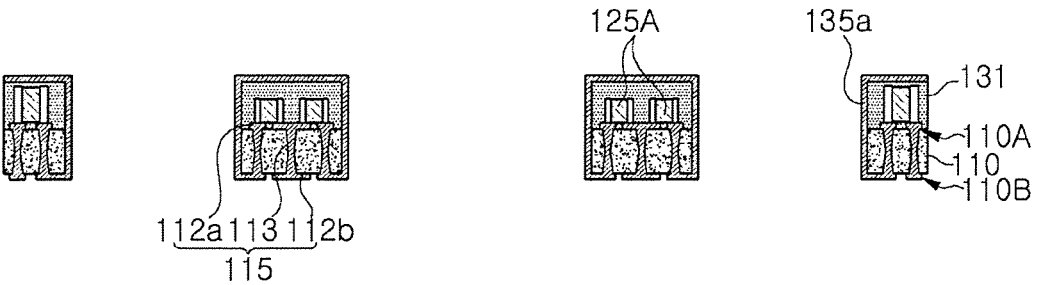

Next, referring to FIG. 11E, the first shielding layer 135a may be formed on side surfaces of the support member 110 and the first encapsulant 131, and the upper surface of the first encapsulant 131.

The first shielding layer 135a formed in the present process may perform a shielding function related to the first passive component 125A disposed on the support member 110 as well as a function of shielding electromagnetic interference between the semiconductor chip 120 and the second passive component 125B which are disposed in the first and second through-holes 110HA and 110HB, respectively. The first shielding layer 135a may be connected to a ground GND pattern. For example, the first shielding layer 135a may be connected to the ground pattern among the redistribution layers 142 and 143 of the connection member 140.

A material of the first shielding layers 135a may be a conductive material such as copper (Cu), aluminum (Al), silver (Ag), tin (Sn), gold (Au), nickel (Ni), titanium (Ti), or alloys thereof, and the first shielding layer 135a may be formed by a plating process.

FIGS. 12A through 12D are cross-sectional views for describing main processes of a method of manufacturing the semiconductor package illustrated in FIG. 9.

Figure 12A:
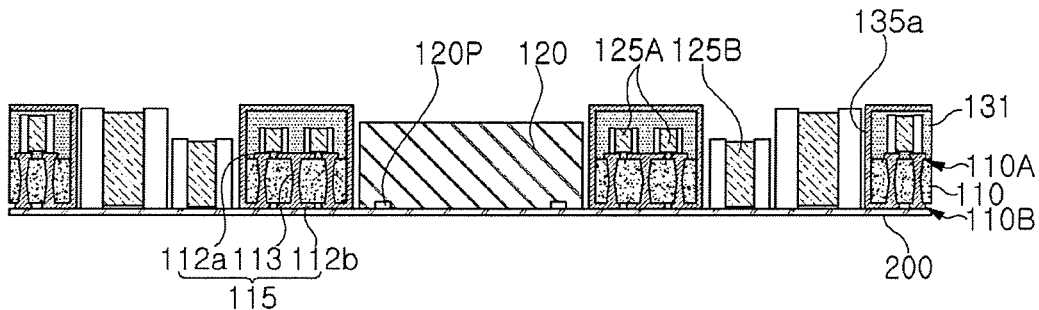
FIGS. 12A through 12D are cross-sectional views for describing main processes of a method of manufacturing the semiconductor package illustrated in FIG. 9.

Referring to FIG. 12A, a carrier film 200 may be attached to the second surface 110B of the support member 110, and the semiconductor chip 120 and the second passive component 125B may be disposed in the first and second through-holes 110HA and 110HB of the support member 110, respectively.

The carrier film 200 may be disposed on the second surface 110B of the support member 110 and may be used as a supporter for treating the support member 110 in a subsequent process. The carrier film 200 employed in the present exemplary embodiment may be a copper foil laminate such as DCF, including an insulating layer and a metal layer. As another example, the carrier film 200 may be various known types of adhesive films. For example, the adhesive film may be a thermosetting adhesive tape of which adhesion is weakened by heat treatment, an ultraviolet-curable adhesive tape of which adhesion is weakened by ultraviolet ray irradiation, or the like.

The semiconductor chip 120 on a region of the carrier film 200 in the through-hole 110HA may be disposed in a face-down form so that the connection pads 122 are attached to the carrier film 200. Similarly, a plurality of second passive components 125B may also be disposed on the region of the carrier film 200 in the second through-hole 110HB.

Figure 12B:
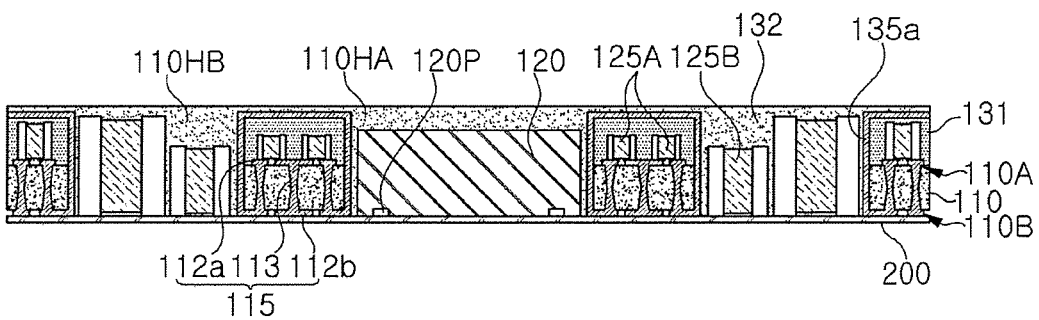

Next, referring to FIG. 12B, the semiconductor chip 120 and the second passive component 125B disposed in the first and second through-holes 110HA and 110HB may be encapsulated using the second encapsulant 132.

According to the present process, the second encapsulant 132 may cover the upper surface of the first encapsulant 131, that is, the upper surface of the first shielding layer 135a. The second encapsulant 132 may be formed by the known method similarly to the first encapsulant 131. For example, a method of laminating ABF may be used. As examples of another method of applying the second encapsulant, various processes such as a screen printing method of applying ink with a squeegee, a spray printing method of applying ink in a mist form, and the like, may be used. As the second encapsulant 132, FR-4, BT resin, and the like may be used other than ABF. In addition, the known molding material such as an epoxy molding compound (EMC), or the like, may also be used, and a photo imagable encapsulant (PIE), which is a photosensitive material, may be used in a certain example.

Figure 12C:
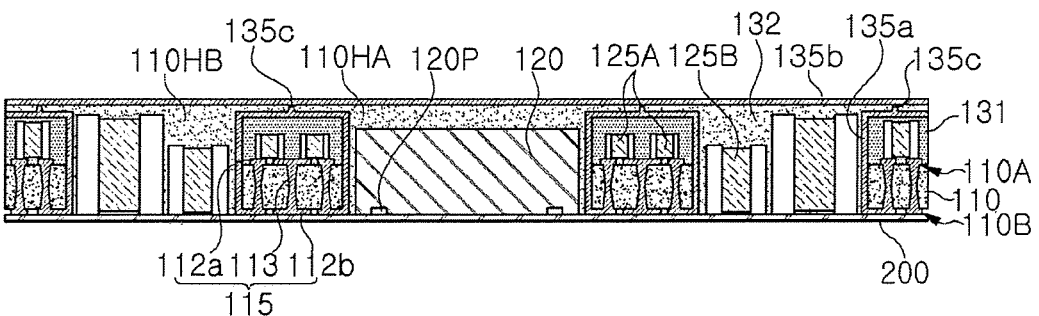

Next, referring to FIG. 12C, the second shielding layer 135b covering the entire semiconductor package may be formed on the upper surface of the second encapsulant 132.

The second shielding layer 135b formed in the present process may be connected to the first shielding layer 135a through a conductive via 135c which is formed in advance in the second encapsulant 132. The second shielding layer 135b may be provided as a single shielding structure together with the first shielding layer 135a. A material of the second shielding layers 135b and the conductive via 135c may be a conductive material such as copper (Cu), aluminum (Al), silver (Ag), tin (Sn), gold (Au), nickel (Ni), titanium (Ti), or alloys thereof, and the second shielding layer 135b and the conductive via 135c may be formed by a plating process.

Figure 12D:
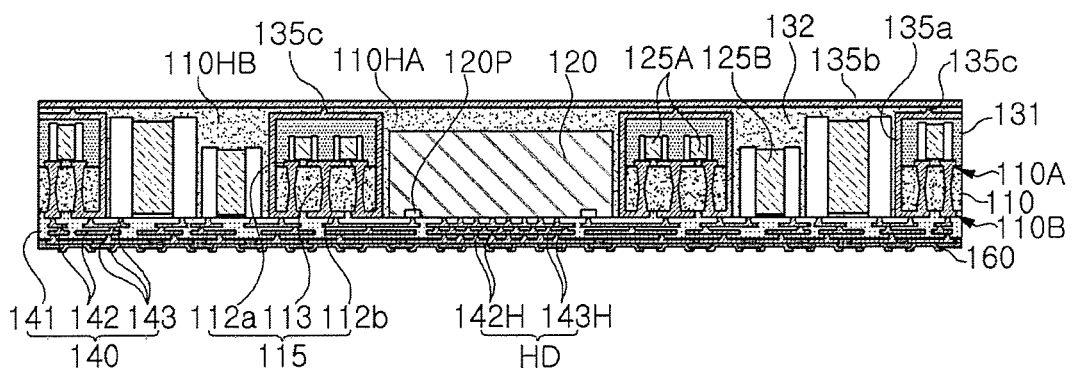

Next, referring to FIG. 12D, the carrier film 200 may be removed, and the connection member 140 may be formed on the second surface 110B of the support member 110.

The connection member may include the redistribution layers 142 and 143 connected to the connection pads 120P of the semiconductor chip 120 and the connection terminal of the second passive component 125B. In addition, the redistribution layers 142 and 143 may be connected to the wiring structure 115 of the support member, that is, the second wiring pattern 112b, and may also be electrically connected to the first passive component 125A disposed on the first surface 110A of the support member 110.

A method of removing the carrier film 200 is not particularly limited, and the carrier film 200 may be removed by the known methods (e.g., physical peel-off, heat treatment, ultraviolet irradiation, and the like). The connection member 140 may be obtained by sequentially forming a plurality of insulating layers 141 and forming the wiring pattern 142 and the via 143 in each of the insulating layers 141.

Additionally, as illustrated in FIG. 9, the passivation layer 150 may be formed on the connection member 140. In addition, the semiconductor package 100A illustrated in FIG. 9 may be manufactured by exposing a portion of the second redistribution layer 153 and then forming an external connection terminal 170. The underbump metal layer 160 may be formed before forming the external connection terminal 170, if necessary.

The respective components according to the exemplary embodiments in the present disclosure may be variously changed and implemented. Although the exemplary embodiment above illustrates a form in which the first and second through-holes are divided, only one through-hole may be employed and the second passive component may be implemented to be mounted in one through-hole together with the semiconductor chip. In addition, according to another exemplary embodiment, the shielding structure may be omitted (FIG. 13), or only a region of the first surface of the support member on which the first passive component is disposed may also be lower than other regions (FIG. 14).

Figure 13:
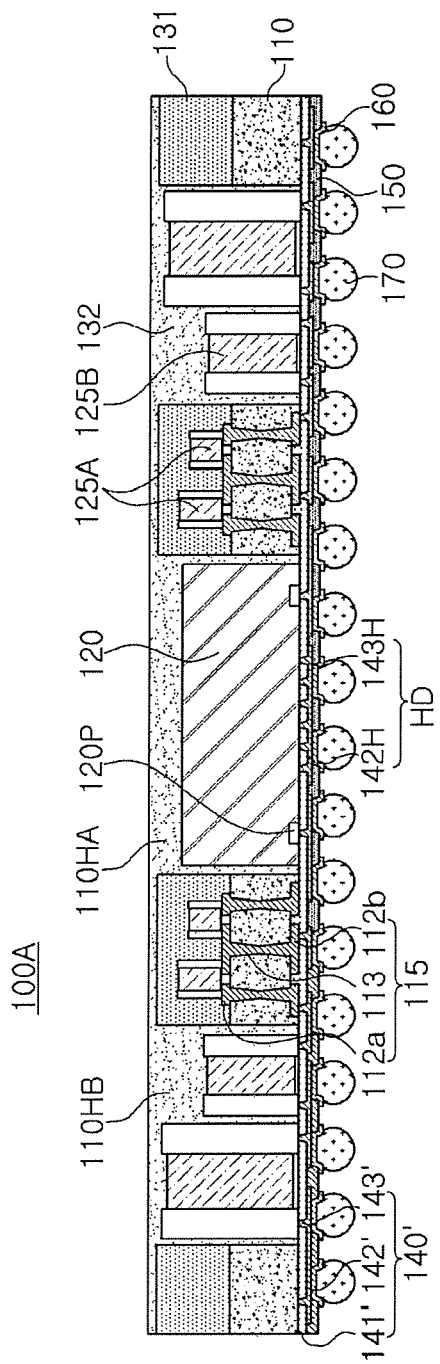
FIGS. 13 and 14 are cross-sectional views illustrating a semiconductor package according to various exemplary embodiments in the present disclosure.
Figure 14:
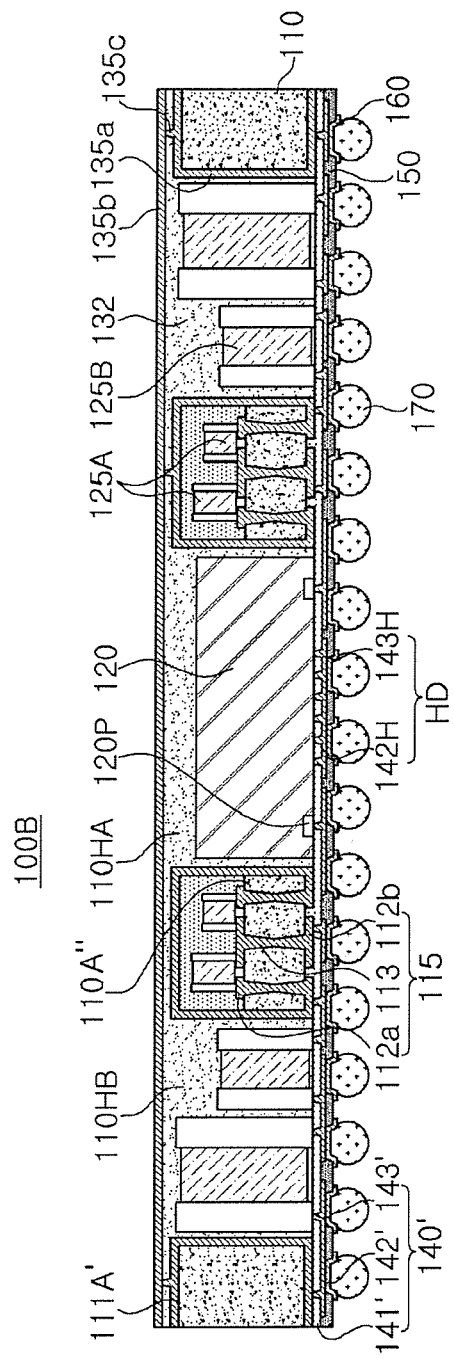

FIGS. 13 and 14 are cross-sectional views illustrating a semiconductor package according to various exemplary embodiments in the present disclosure.

Referring to FIG. 13, the semiconductor package 100A according to the present exemplary embodiment may be understood as a structure similar to that illustrated in FIGS. 9 and 10 except that the first passive component 125A is disposed on only a portion of the first surface 110A of the support member 110 and a connection member 140' has a single redistribution layer while the shielding layer is not employed. Components according to the present exemplary embodiment may be understood with reference to the description for the same or similar components of the semiconductor package 100 illustrated in FIGS. 9 and 10 unless explicitly described to the contrary.

As illustrated in FIG. 13, the first passive component 125A may be disposed on only a portion of the first surface 110A of the support member 110. For example, the first passive component 125A may be disposed on only an upper surface of a partition structure of the first and second through-holes 110HA and 110HB and may not be disposed on an edge region of the semiconductor package. In addition, one or both of the shielding layers may not be additionally formed, and the first passive component 125A may be packaged by the first encapsulant 131 and the second encapsulant 132 may be formed to be in direct contact with the first encapsulant 131. As an example, the second encapsulant 132 may be formed of the same material as the first encapsulant 131. In a case in which a separate shielding layer is not formed as in the present exemplary embodiment, the first encapsulant 131 may not be formed by a separate process (i.e., omit the process of FIG. 11C) and upon forming the second encapsulant 132 (process of FIG. 12B), the second encapsulant 132 may be formed in a single encapsulant to also form the region represented by the first encapsulant 131 in FIG. 13.

In addition, a single retribution layer corresponding to a form in which the connection member 140' has single redistribution layers 142' and 143' may form the wiring structure 115 of the support member 110 and a via 143' which is electrically connected to the semiconductor chip 120 and the second passive component 125B in an insulating layer 141', and may include a wiring pattern 142' connected to the via 143' on the insulating layer 141'. According to another exemplary embodiment, the redistribution layer may be formed in a plurality of layers (particularly, three or more layers) instead of a single layer.

Referring to FIG. 14, a semiconductor package 100B according to the present exemplary embodiment may be understood as a structure similar to that illustrated in FIGS. 9 and 10 except that a level of the first surface of the support member 110 differs and the connection member 140' has a single redistribution layer. Components according to the present exemplary embodiment may be understood with reference to the description for the same or similar components of the semiconductor package 100 illustrated in FIGS. 9 and 10 unless explicitly described to the contrary. In addition, the connection member 140' may be understood with reference to the description of the connection member illustrated in FIG. 13.

The first surface of the support member 110 employed in the present exemplary embodiment may have a different level. Specifically, as illustrated in FIG. 14, a region 110A" of the first surface of the support member 110 on which the first passive component 125A is disposed may have a level lower than that of another region 110A' of the first surface of the support member. The region 110A" of the first surface of the support member 110 on which the first passive component 125A is disposed may be the upper surface of the partition structure between the first and second through-holes 110HA and 110HB similarly to the example illustrated in FIG. 13. When an insulating structure for the support member 110 is prepared, a height of the upper surface may be formed to be lower by machining only the region 110A" on which the first passive component 125A is to be disposed. In this case, the first encapsulant 131 may be provided to only the region 110A" on which the first passive component 125A is disposed, and an upper surface of the first encapsulant 131 may have a plane which is substantially the same as the level of the region 110A' on which the first passive component 125A is not disposed. In this case, the first encapsulant 131 may not be formed on the region 110A' on which the first passive component 125A is not disposed.

As described above, a size of a module may be reduced by utilizing the first surface of the support member 110 as the mounted area, and noise on electromagnetic interference (EMI) between the components may be reduced by reducing an interval between the components. Meanwhile, EMI shielding performance may be improved by introducing an additional shielding structure.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to an exemplary embodiment in the present disclosure, an upper surface of the support member may be utilized as a component mounting area, thereby increasing the component mounting area. As a result, a module size may be reduced, and an interval between the components may be reduced, thereby reducing noise on electromagnetic interference (EMI) between the components. EMI shielding performance may be improved by introducing an additional shielding structure.

Various advantages and effects of the present disclosure are not limited to the description above, and may be more readily understood in the description of exemplary embodiments in the present disclosure.

What is claimed is:

1. A semiconductor package comprising:
    a support member having first and second surfaces opposing each other, having first and second through-holes spaced apart from each other, and having a wiring structure connecting the first and second surfaces to each other;
    a first passive component disposed on the first surface of the support member and connected to the wiring structure;
    a connection member disposed on the second surface of the support member and having redistribution layers connected to the wiring structure;
    a semiconductor chip disposed in the first through-hole and having connection pads connected to the redistribution layers;
    a second passive component disposed in the second through-hole and connected to the redistribution layers;
    a first encapsulant disposed on the first surface of the support member and encapsulating the first passive component;
    a second encapsulant encapsulating the support member, the first encapsulant, and the semiconductor chip; and
    a first shielding layer disposed on side surfaces of the support member and the first encapsulant, and an upper surface of the first encapsulant.

2. The semiconductor package of claim 1, further comprising a second shielding layer disposed on the second encapsulant and connected to the first shielding layer.

3. The semiconductor package of claim 1, wherein a side surface of the first encapsulant is substantially coplanar with a side wall of the support member.

4. The semiconductor package of claim 1, wherein a region of the first surface of the support member on which the first passive component is disposed has a level lower than that of other regions of the first surface of the support member.

5. The semiconductor package of claim 1, wherein the connection member includes a heat dissipation unit disposed in a region corresponding to the semiconductor chip.

6. The semiconductor package of claim 1, wherein the first passive component has a size less than that of the second passive component.

7. The semiconductor package of claim 1, wherein at least one of the first and second passive components includes a plurality of passive components having different sizes.

8. The semiconductor package of claim 1, wherein a mounted height of the semiconductor chip is higher than a thickness of the support member, and
   a height of the upper surface of the first encapsulant is higher than the mounted height of the semiconductor chip.

9. The semiconductor package of claim 1, wherein the first encapsulant is formed of a same resin as the second encapsulant.

10. The semiconductor package of claim 1, wherein the second through-hole is a plurality of second through-holes, and the plurality of second through-holes surround the first through-hole.

11. The semiconductor package of claim 1, wherein the first passive component is disposed on a portion of the support member which separates the first and second through-holes from each other.

12. A semiconductor package comprising:
   a support member having first and second surfaces opposing each other, having at least one through-hole, and having a wiring structure connecting the first and second surfaces to each other;
   a first passive component disposed on the first surface of the support member and connected to the wiring structure;
   a connection member disposed on the second surface of the support member and having redistribution layers connected to the wiring structure;
   a semiconductor chip disposed in the at least one through-hole and having connection pads connected to the redistribution layers;
   a second passive component disposed in the at least one through-hole and connected to the redistribution layers;
   a first encapsulant disposed on the first surface of the support member and encapsulating the first passive component;
   a second encapsulant encapsulating the support member, the first encapsulant, the semiconductor chip, and the second passive component; and
   a shielding layer disposed on side surfaces of the support member and the first encapsulant, and an upper surface of the first encapsulant,
   wherein the first encapsulant has a side surface being substantially coplanar with an inner side surface of the at least one through-hole of the support member.

13. The semiconductor package of claim 12, wherein the first encapsulant is disposed on the first surface of the support member and has a structure corresponding to the support member.

* * * * *